(12) United States Patent
Hwang

(10) Patent No.: US 10,748,471 B2
(45) Date of Patent: Aug. 18, 2020

(54) GATE DRIVING CIRCUIT AND DISPLAY DEVICE HAVING THE SAME

(71) Applicant: Samsung Display Co., LTD., Yongin-si, Gyeonggi-Do (KR)

(72) Inventor: Junghwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/234,446

(22) Filed: Dec. 27, 2018

(65) Prior Publication Data

US 2019/0206303 A1  Jul. 4, 2019

(30) Foreign Application Priority Data

Jan. 4, 2018 (KR) .................. 10-2018-0001033

(51) Int. Cl.
*G09G 3/20* (2006.01)

(52) U.S. Cl.
CPC ... *G09G 3/2092* (2013.01); *G09G 2310/0267* (2013.01); *G09G 2310/0275* (2013.01); *G09G 2310/0286* (2013.01); *G09G 2310/0291* (2013.01); *G09G 2310/0294* (2013.01); *G09G 2310/08* (2013.01)

(58) Field of Classification Search
CPC ......... G09G 3/2092; G09G 2310/0267; G09G 2310/08; G09G 2310/0275; G09G 2310/0291; G09G 2310/0286; G09G 2310/0294; G09G 3/3677; G09G 3/3648; G09G 3/3696
See application file for complete search history.

(56) References Cited

U.S. PATENT DOCUMENTS

| 8,730,144 B2 | 5/2014 | Lee et al. | |
|---|---|---|---|
| 2012/0139883 A1* | 6/2012 | Lee | G09G 3/3611 345/204 |
| 2013/0087793 A1* | 4/2013 | Kim | G02F 1/13458 257/59 |
| 2013/0141318 A1* | 6/2013 | Kim | G09G 3/36 345/87 |

(Continued)

FOREIGN PATENT DOCUMENTS

| KR | 10-1773136 | 7/2012 |
|---|---|---|
| KR | 10-1352289 | 1/2014 |
| KR | 10-2017-0035404 | 3/2017 |

*Primary Examiner* — Md Saiful A Siddiqui
(74) *Attorney, Agent, or Firm* — Lewis Roca Rothgerber Christie LLP

(57) ABSTRACT

A gate driving circuit comprising stages cascade-connected with each other and configured to output gate signals, a stage of the stages including a pull-up circuit configured to output a high voltage of a clock signal as a high voltage of a gate signal in response to a bootstrap voltage of a control node in a period of a frame period, a first discharging circuit configured to discharge a voltage of the control node to a first low voltage in response to a carry signal of at least one stage of the plurality of stages that is subsequent to the stage, and a second discharging circuit configured to discharge a voltage of the control node to a second low voltage being lower than the first low voltage in response to a carry signal of at least one stage of the plurality of stages that is subsequent to the stage.

20 Claims, 15 Drawing Sheets

(56) References Cited

U.S. PATENT DOCUMENTS

2014/0092078 A1* 4/2014 Yoon ................. G09G 5/001
 345/212
2017/0084245 A1 3/2017 Hwang et al.
2017/0110076 A1 4/2017 Hwang et al.

* cited by examiner

<EXEMPLARY EMBODIMENT>

<COMPARATIVE EXEMPLARY EMBODIMENT1>

<EXEMPLARY EMBODIMENT2>

GATE DRIVING CIRCUIT AND DISPLAY DEVICE HAVING THE SAME

CROSS-REFERENCE TO RELATED APPLICATION

This application claims priority to and the benefit of Korean Patent Application No. 10-2018-0001033, filed on Jan. 4, 2018, which is hereby incorporated by reference in its entirety for all purposes as if fully set forth herein.

BACKGROUND

1. Field

Aspects of the inventive concept relate to a gate driving circuit and a display apparatus having the gate driving circuit.

2. Description of the Related Art

Recently, various flat panel display devices that have weight and size advantages over related art display devices such as cathode ray tube (CRT) have been developed. Examples of the flat panel display devices include a liquid crystal display (LCD) device, a field emission display (FED) device, a plasma display panel PDP, and an organic light emitting display (OLED) device.

The OLED device has advantages such as a rapid response speed and low power consumption because the OLED device uses an organic light emitting diode that emits a light based on recombination of electrons and holes.

SUMMARY

Aspects of embodiments of the inventive concept are directed toward a gate driving circuit for improving driving reliability.

Aspects of embodiments of the inventive concept are directed toward a display apparatus having the gate driving circuit.

According to some exemplary embodiments of the inventive concept, there is provided a gate driving circuit comprising a plurality of stages cascade-connected with each other and configured to output a plurality of gate signals, an n-th stage ('n' being a natural number greater than one) of the plurality of stages including: a pull-up circuit configured to output a high voltage of a clock signal as a high voltage of an n-th gate signal in response to a bootstrap voltage of a control node in an n-th period of a frame period; a first discharging circuit configured to discharge a voltage of the control node to a first low voltage in response to a carry signal of at least one stage of the plurality of stages that is subsequent to the n-th stage; a second discharging circuit configured to discharge a voltage of the control node to a second low voltage being lower than the first low voltage in response to a carry signal of at least one stage of the plurality of stages that is subsequent to the n-th stage; a carry circuit configured to output the high voltage of the clock signal as a high voltage of an n-th carry signal in response to the bootstrap voltage of the control node; an inverter configured to output an inverting signal in synchronization with the clock signal during the frame period except for the n-th period; a first holding circuit configured to maintain the n-th carry signal to the second low voltage in response to a high voltage of the inverting signal; and a second holding circuit configured to maintain a voltage of the control node to the second low voltage of the n-th carry signal in response to the high voltage of the inverting signal.

In some embodiments, the first discharging circuit is configured to discharge a voltage of the control node to the first low voltage in response to a high voltage of an (n+1)-th carry signal.

In some embodiments, the second discharging circuit is configured to discharge a voltage of the control node to the second low voltage in response to a high voltage of an (n+2)-th carry signal.

In some embodiments, the gate drive circuit further includes: a pull-down circuit configured to pull-down a high voltage of an n-th gate signal to a first low voltage in response to a carry signal of the at least one stage of the plurality of stages that is subsequent to the n-th stage.

In some embodiments, the gate drive circuit further includes: a third holding circuit configured to maintain the n-th gate signal at the first low voltage in response to the high voltage of the inverting signal.

In some embodiments, the gate drive circuit further includes: a buffer circuit configured to provide a high voltage of an (n−1)-th carry signal to a capacitor connected to the control node, wherein the capacitor provides the bootstrap voltage to the control node in response to the high voltage of the clock signal in the n-th period.

In some embodiments, the second holding circuit includes: a sixteenth transistor including a control electrode configured to receive the inverting signal, a first electrode connected to the control node, and a second electrode connected to the carry circuit; and a seventeenth transistor including a control electrode configured to receive the inverting signal, a first electrode connected to the second electrode of the sixteenth transistor, and a second electrode configured to receive the second low voltage.

In some embodiments, the second discharging circuit includes: an eighteenth transistor including a control electrode configured to receive the (n+2)-th carry signal, a first electrode connected to the control node, and a second electrode connected to the carry circuit; and a nineteenth transistor including a control electrode configured to receive the (n+2)-th carry signal, a first electrode connected to the second electrode of the eighteenth transistor, and a second electrode configured to receive the second low voltage, wherein a connection node is connected between the eighteenth and nineteenth transistors and the connection node is connected to the carry circuit.

In some embodiments, the second discharging circuit further includes a diode connected between the connection node and the carry circuit.

In some embodiments, the buffer circuit includes: a twentieth transistor including a control electrode and a first electrode configured to receive the (n−1)-th carry signal; a 21st transistor including a control electrode and a first electrode connected to a second electrode of the twentieth transistor and a second electrode connected to the control node; and a diode connected to the control node and a connection node, the connection node being connected between the twentieth and 21st transistors and the control node.

According to some exemplary embodiments of the inventive concept, there is provided a display apparatus including: a display panel including a display area on which gate lines and data lines crossing the gate line are arrayed to display an image, and further including a peripheral area surrounding the display area; a data drive circuit configured to output data signals to the data lines; and a gate drive circuit including a shift register in which a plurality of stages are connected one after another to each other, an n-th stage of the plurality of stages ('n' being a natural number greater than one) including: a pull-up circuit configured to output a high voltage of a clock signal as a high voltage of an n-th gate signal in response to a bootstrap voltage of a control node in an n-th period of a frame period; a first discharging circuit configured to discharge a voltage of the control node to a first low voltage in response to a carry signal of at least one stage of the plurality of stages that is subsequent to the n-th stage; a second discharging circuit configured to discharge a voltage of the control node to a second low voltage being lower than the first low voltage in response to a carry signal of at least one stage of the plurality of stages that is subsequent to the n-th stage; a carry circuit configured to output the high voltage of the clock signal as a high voltage of an n-th carry signal in response to the bootstrap voltage of the control node; an inverter configured to output an inverting signal in synchronization with the clock signal during the frame period except for the n-th period; a first holding circuit configured to maintain the n-th carry signal at the second low voltage in response to a high voltage of the inverting signal; and a second holding circuit configured to maintain a voltage of the control node at the second low voltage of the n-th carry signal in response to the high voltage of the inverting signal.

In some embodiments, the first discharging circuit is configured to discharge a voltage of the control node to the first low voltage in response to a high voltage of an (n+1)-th carry signal.

In some embodiments, the second discharging circuit is configured to discharge a voltage of the control node to the second low voltage in response to a high voltage of an (n+2)-th carry signal.

In some embodiments, the n-th stage further includes: a pull-down circuit configured to pull-down a high voltage of an n-th gate signal to a first low voltage in response to a carry signal of the at least one stage of the plurality of stages that is subsequent to the n-th stage.

In some embodiments, the n-th stage further includes: a third holding circuit configured to maintain the n-th gate signal at the first low voltage in response to the high voltage of the inverting signal.

In some embodiments, the n-th stage further includes a buffer circuit configured to provide a capacitor connected to the control node with a high voltage of an (n−1)-th carry signal, and the capacitor is configured to provide the control node with the bootstrap voltage in response to the high voltage of the clock signal in the n-th period.

In some embodiments, the second holding circuit includes: a sixteenth transistor including a control electrode configured to receive the inverting signal, a first electrode connected to the control node, and a second electrode connected to the carry circuit; and a seventeenth transistor including a control electrode configured to receive the inverting signal, a first electrode connected to the second electrode of the sixteenth transistor, and a second electrode configured to receive the second low voltage.

In some embodiments, the second discharging circuit includes: an eighteenth transistor including a control electrode configured to receive the (n+2)-th carry signal, a first electrode connected to the control node, and a second electrode connected to the carry circuit; and a nineteenth transistor including a control electrode configured to receive the (n+2)-th carry signal, a first electrode connected to the second electrode of the eighteenth transistor, and a second electrode configured to receive the second low voltage, wherein a connection node is connected between the eighteenth and nineteenth transistors, and the connection node is connected to the carry circuit.

In some embodiments, the second discharging circuit further includes a diode connected between the connection node and the carry circuit.

In some embodiments, the buffer circuit includes: a twentieth transistor including a control electrode and a first electrode configured to receive the (n−1)-th carry signal; a 21st transistor including a control electrode and a first electrode connected to a second electrode of the twentieth transistor and a second electrode connected to the control node; and a diode connected to the control node and a connection node, the connection node being connected between the twentieth and 21st transistors and the control node.

According to the inventive concept, when the gate driving circuit is driven while the display panel is operating at high temperature, the voltage of the control node may be maintained at the second low voltage in response to the output signal of the inverter. In addition, in the n-th period in which the control node is bootstrapped, the kink leakage current (i.e., the leakage current due to the kink effect) is avoided or substantially reduced, and thus, the bootstrap voltage of the control node is prevented from being dropped (or the drop is substantially reduced). Therefore, distortion of the gate signal may be avoided or substantially reduced.

BRIEF DESCRIPTION OF THE DRAWINGS

The above and other features and aspects of the inventive concept will become more apparent by describing in detailed exemplary embodiments thereof with reference to the accompanying drawings, in which.

DETAILED DESCRIPTION

Hereinafter, the inventive concept will be explained in detail with reference to the accompanying drawings.

Figure 1:
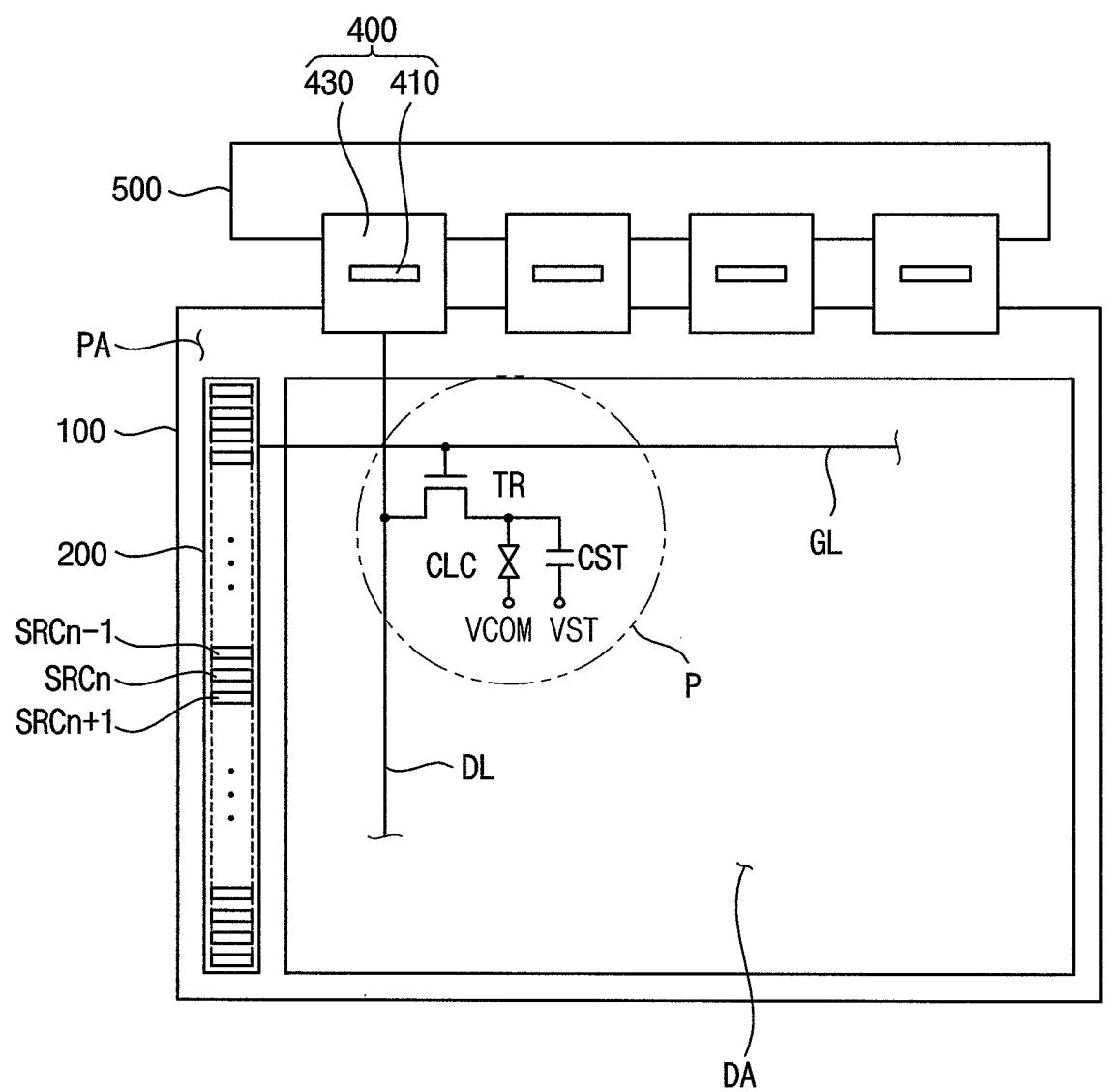
FIG. 1 is a block diagram illustrating a display apparatus according to an exemplary embodiment.

FIG. 1 is a block diagram illustrating a display apparatus according to an exemplary embodiment.

Referring to FIG. 1, the display apparatus includes a display panel 100, a gate drive circuit 200, a data drive circuit 400, and a printed circuit board ("PCB") 500.

The display panel 100 includes a display area DA and a peripheral area PA surrounding the display area DA. A plurality of gate lines GL and a plurality of source lines DL and a plurality of pixel parts (e.g., pixels) P are formed on the display area DA. The gate lines and the source lines are crossed with each other. Each of the pixel parts P includes a switching element TR electrically connected to the gate line GL and the source line DL, a liquid crystal capacitor CLC electrically connected to the switching element TR, and a storage capacitor CST connected in parallel with the liquid crystal capacitor CLC.

The gate drive circuit 200 includes a shift register, which sequentially outputs gate signals of a high level to the gate lines GLs. The shift register includes a plurality of stages SRCn−1, SRCn, and SRCn+1, wherein 'n' is a natural number greater than one. The gate drive circuit 200 is integrated on the peripheral area PA adjacent to a first terminal portion of the gate lines GL. In the present exemplary embodiment, the gate drive circuit 200 is integrated on a first end portion of the gate lines GLs. In some examples, the gate drive circuit 200 may be integrated on two end portions of the gate lines GLs.

The data drive circuit 400 includes a data drive chip 410 and a flexible circuit substrate 430. The data drive chip 410 is mounted on the flexible circuit substrate 430 to provide the data lines DLs with data signals. The flexible circuit substrate 430 makes electrical contacts with the PCB 500 and the display panel 100. In this exemplary embodiment, the data drive chip 410 is mounted on the flexible circuit substrate 430. In some examples, the data drive chip 410 is directly mounted on the display panel 100. Further, in some examples, the data drive chip 410 may be directly integrated on the peripheral area PA of the display panel 100.

Figure 2:
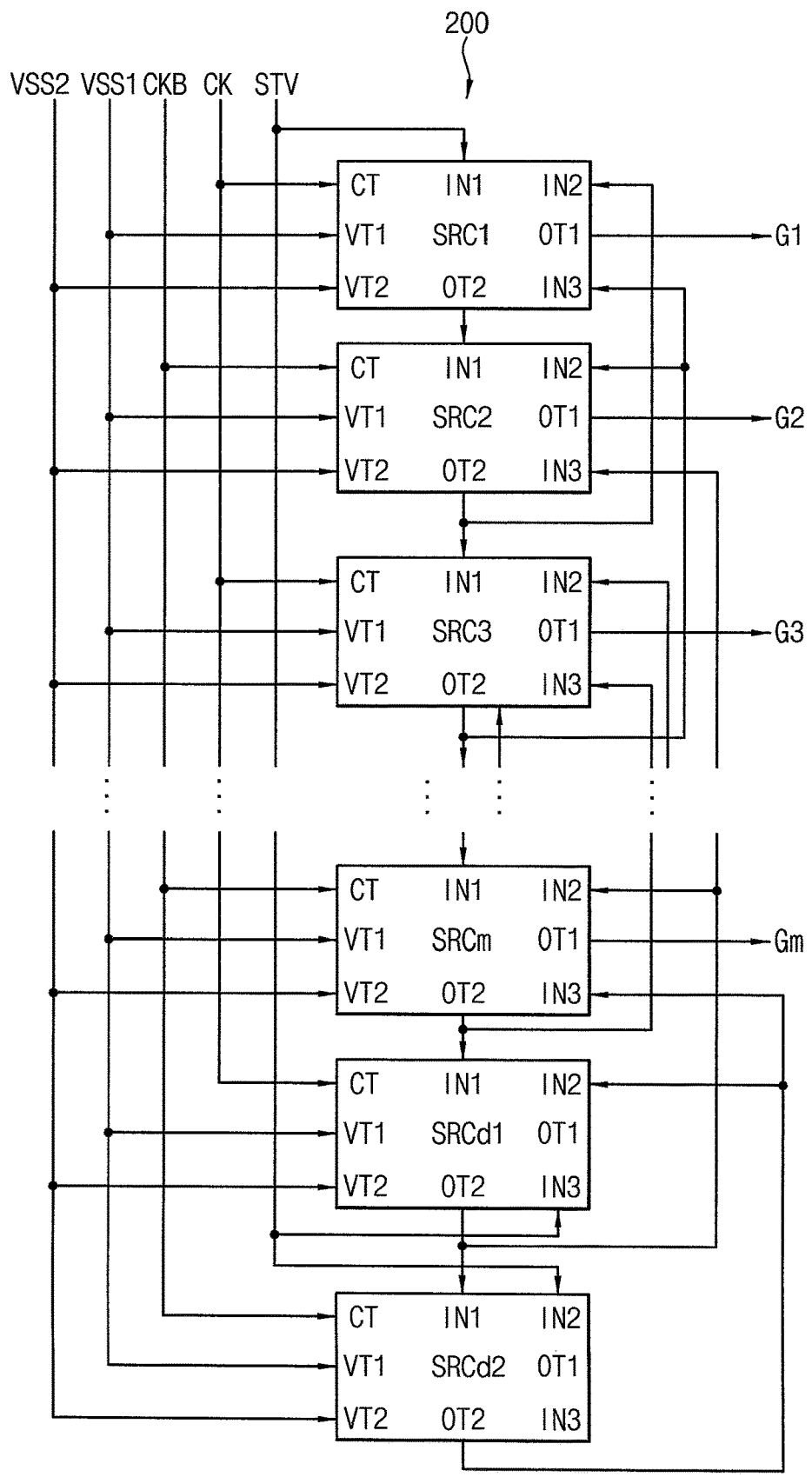
FIG. 2 is a block diagram illustrating a gate drive circuit of FIG. 1.

FIG. 2 is a block diagram illustrating a gate drive circuit of FIG. 1.

Referring to FIG. 2, the gate drive circuit 200 includes a shift register including first to m-th stages SRC1 to SRCm that are connected one after another or sequentially connected to each other, and further including a first dummy stage SRCd1 and a second dummy stage SRCd2. In this embodiment, 'm' is a natural number greater than one.

The first to m-th stages SRC1 to SRCm are respectively connected to first to m-th gate lines to sequentially provide the gate lines with first to m-th gate signals. A first dummy stage SRCd1 may control a driving of the (m−1)-th and m-th stages SRCm−1 and SRCm, and a second dummy stage SRCd2 may control a driving of the m-th stage SRCm and the first dummy stage SRCd1. The first and second dummy stages SRCd1 and SRCd2 may not be connected to gate lines.

Each of the stages includes a clock terminal CT, a first input terminal IN1, a second input terminal IN2, a third input terminal IN3, a first voltage terminal VT1, a second voltage terminal VT2, a first output terminal OT1 and a second output terminal OT2.

The clock terminal CT receives a first clock signal CK or a second clock signal different from the first clock signal CK. For example, the second clock signal may have a phase opposite to the first clock signal CK. Hereinafter, the first clock signal may be referred to as the clock signal CK and the second clock signal may be referred to as an inverted clock signal CKB.

For example, the first clock terminals CT1 of odd-numbered stages SRC1, SRC3, . . . , SRCd1 receive the clock signal CK, and the first clock terminals CT1 of even-numbered stages SRC2, SRC4, . . . , SRCd2 receive the inverted clock signal CKB. The clock signal CK and the inverted clock signal CKB may include a high voltage VDD and a first low voltage VSS1.

The first input terminal IN1 receives a vertical start signal STV or a carry signal of a corresponding previous stage. The first input terminal IN1 of the first stage SRC1 receives the vertical start signal STV, and the first input terminals IN1 of the second stage SRC2 to second dummy stage SRCd2 respectively receive a carry signal of a corresponding previous stage. For example, the first input terminal IN1 of the n-th stage receives an (n−1)-th carry signal CRn−1 of an (n−1)-th stage SRCn−1.

The second input terminal IN2 receives a first carry signal of a first next stage or a vertical start signal STV. The second input terminals IN2 of the first stage SRC1 to first dummy stage SRCd1 respectively receive a first carry signal of a corresponding first next stage. For example, the second input terminal IN2 of the n-th stage receives an (n+1)-th carry signal CRn−1 of an (n+1)-th stage SRCn+1. The second input terminal IN2 of the second dummy stage SRCd2, which is a last stage, may receive the vertical signal STV corresponding to a vertical start signal of the following frame.

The third input terminal IN3 receives a second carry signal of a second next stage or a vertical start signal STV. The second next stage may be next to the first next stage. The third input terminals IN3 of the first stage SRC1 to m-th stage SRCm respectively receive a second carry signal of a corresponding second next stage. The third input terminal IN3 of the first dummy stage SRCd1 receives the vertical start signal STV. For example, the third input terminal IN3 of the n-th stage SRCn receives an (n+2)-th carry signal CRn+2 of an (n+2)-th stage SRCn+2.

The first voltage terminal VT1 receives the first low voltage VSS1. The first low voltage VSS1 has a first low level. The first low level corresponds to a discharging level of the gate signal. For example, the first low level may be about −6 V.

The second voltage terminal VT2 receives a second low voltage VSS2 having a second low level lower than the first low level. The second low level corresponds to a discharging level of a control node Q (hereinafter, Q node) included in the stage. For example, the second low level may be about −10 V.

The first output terminal OT1 is electrically connected to a corresponding gate line to output the gate signal. The first output terminals OT1 of the first to m-th stage SRC1 to SRCm output first to m-th gate signals, respectively. Each of the first output terminals OT1 of the first and second dummy stages SRCd1 and SRCd2 may not output gate signals.

The second output terminal OT2 outputs the carry signal. The second output terminal OT2 is electrically connected to a first input terminal IN1 of at least one stage of the next stages. Moreover, the second output terminal OT2 is electrically connected to the second terminal IN2 of a first previous stage and a third input terminal IN3 of a second previous stage.

Figure 3:
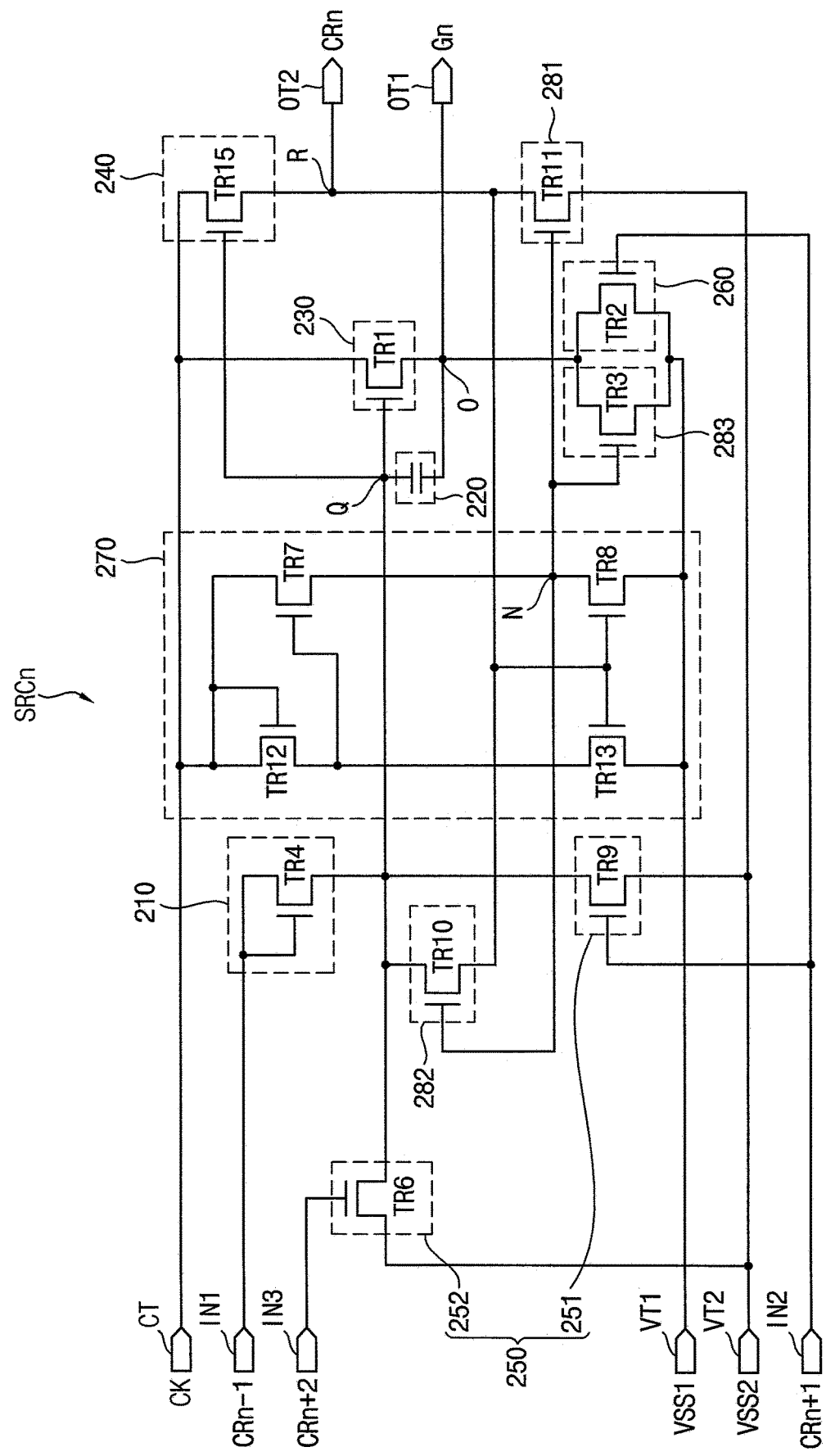
FIG. 3 is a circuit diagram illustrating a stage of FIG. 2.
Figure 4:
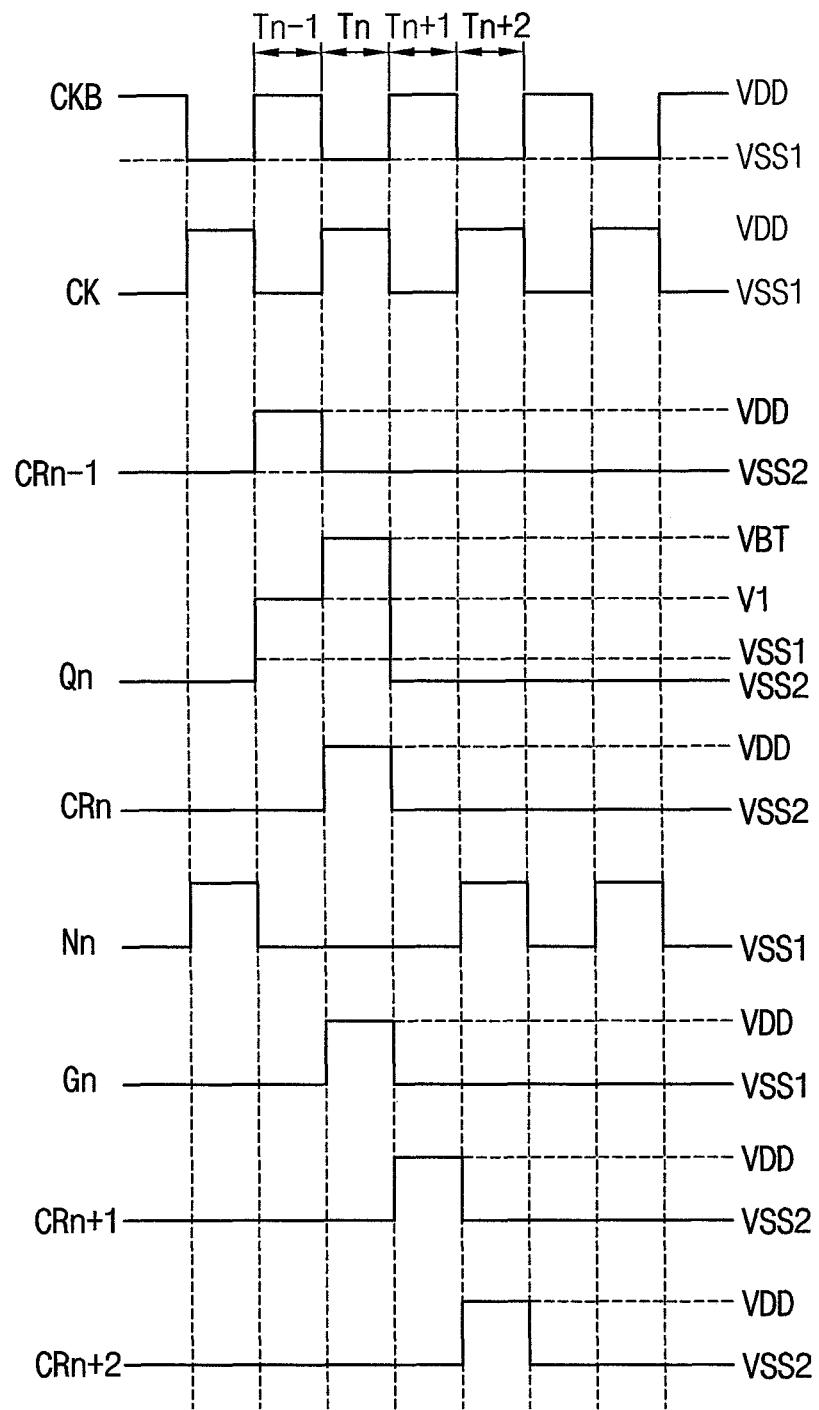
FIG. 4 is waveform diagrams showing signals of a stage of FIG. 3.

FIG. 3 is a circuit diagram illustrating a stage of FIG. 2. FIG. 4 is waveform diagrams showing signals of a stage of FIG. 3.

Referring to FIGS. 3 and 4, an n-th stage SRCn includes a buffer part (e.g., a buffer circuit) 210, a charging part (e.g., a charging circuit) 220, a pull-up part (e.g., a pull-up circuit)

230, a carry part (e.g., a carry circuit) 240, a discharging part (e.g., a discharging circuit) 250, a pull-down part (e.g., a pull-down circuit) 260, an inverter 270, a first holding part (e.g., a first holding circuit) 281, a second holding part (e.g., a second holding circuit) 282, and a third holding part (e.g., a third holding circuit) 283.

The buffer part 210 transfers the (n−1)-th carry signal CRn−1 to the pull-up part 230. The buffer part 210 may include a fourth transistor TR4. The fourth transistor TR4 includes control and input electrodes which are connected to the first input terminal IN1 and an output electrode which is connected to the Q node Q.

The charging part 220 is charged in response to the high voltage VDD of the (n−1)-th carry signal CRn−1 provided from the buffer part 210. A first terminal of the charging part 220 is connected to the Q node Q, and a second terminal is connected to an output node O in which the gate signal is outputted. When a high voltage VDD of the (n−1)-th carry signal CRn−1 is applied to the buffer part 210, the charging part 220 charges a first voltage V1 corresponding to the high voltage VDD.

The pull-up part 230 outputs the gate signal. The pull-up part 230 may include a first transistor TR1. The first transistor TR1 includes a control electrode connected to the Q node Q, an input electrode connected to the clock terminal CT and an output electrode connected to the output mode O. The output node O is connected to the first output terminal OT1.

In a status in which the first voltage V1 charged in the charging part 220 is applied to a control electrode of the pull-up part 230, when the clock terminal CT receives a high voltage VDD of the clock signal CK, the pull-up part 230 is bootstrapped. In this case, the Q node Q connected to the control electrode of the pull-up part 230 is boosted up to a boosting voltage VBT at the first voltage V1. That is, the Q node Q has the first voltage V1 at an (n−1)-th period Tn−1, and has the boosting voltage VBT at an n-th period Tn.

During the n-th period Tn in which the boosting voltage VBT is applied to the control electrode of the pull-up part 230, the pull-up part 230 outputs a high voltage VDD of the clock signal CK as a high voltage VDD of an n-th gate signal Gn. The n-th gate signal Gn is outputted through the first output terminal OT1 connected to the output node O.

The carry part 240 outputs an n-th carry signal CRn. The carry part 240 may include a fifth transistor TR5. The fifth transistor TR5 includes a control electrode connected to the Q node Q, an input electrode connected to the clock terminal CT and an output electrode connected to a carry node R. The carry node R is connected to a second output terminal OT2.

The carry part 240 may further include a capacitor C connecting to the control and output electrodes of the fifth transistor TR5. When a high voltage is applied to the Q node Q, the carry part 240 outputs a high voltage VDD of the clock signal CK as an n-th carry signal CRn, which is received to the clock terminal CT. The n-th carry signal CRn is outputted through the second output terminal OT2 connected to the carry node R.

The discharging part 250 discharges a high voltage of the Q node Q into a second low voltage VSS2 having a level lower than the first low voltage VSS1 in response to at least one of carry signals outputted from the next stages. In the present exemplary embodiment, the discharging part 250 discharges a high voltage of the Q node Q into the second low voltage VSS2 in response to the (n+1)-th and (n+2)-th carry signals CRn+1 and CRn+2 outputted from the (n+1)-th and (n+2)-th stages SRCn+1 and SRCn+2.

The discharging part 250 includes a first discharging part 251 and a second discharging part 252.

The first discharging part 251 may include a ninth transistor TR9. The ninth transistor TR9 includes a control electrode (e.g., a gate electrode) connected to the second input terminal IN2, an input terminal connected to the Q node Q and an output terminal connected to the first voltage terminal VT1. When the (n+1)-th carry signal CRn+1 is applied to the second input terminal IN2, the first discharging part 251 discharges a voltage of the Q node Q to the second low voltage VSS2 applied to the second voltage terminal VT2.

The second discharging part 252 may include a sixth transistor TR6. The sixth transistor TR6 includes a control electrode connected to a third input terminal IN3, an input terminal connected to the Q node Q and an output terminal connected to the second voltage terminal VT2. When the (n+2)-th carry signal CRn+2 is applied to the third input terminal IN3, the second discharging part 252 discharges a voltage of the Q node Q to the second low voltage VSS2 applied to the second voltage terminal VT2.

Thus, a voltage of the Q node Q has the boosting voltage VBT at an n-th period Tn. The voltage of the Q node Q is discharged into the second low voltage VSS2 during a frame period except for the n-th period Tn.

The pull-down part 260 pulls-down the n-th gate signal Gn. The pull-down part 260 may include a second transistor TR2. The second transistor TR2 includes a control electrode connected to the second input terminal IN2, an input electrode connected to the output node O and an output electrode connected to the first voltage terminal VT1. When an (n+1)-th carry signal CRn+1 is applied to the second input terminal IN2, the pull down part 260 pulls-down a voltage of the output node O into the first low voltage VSS1 applied to the first voltage terminal VT1.

The inverter 270 applies an inverting signal, which has a phase identical to that of the clock signal CK received at the clock terminal CT, to an inverting node N (hereinafter, N node) during the frame period except for the n-th period Tn in which the high voltage of the n-th carry signal CRn is outputted. The inverter 270 may include an eleventh transistor TR12, a seventh transistor TR7, a thirteenth transistor TR13 and an eighth transistor TR8.

The twelfth transistor TR12 includes a control electrode and an input electrode that are connected to the clock terminal CT, and an output electrode that are connected to an input electrode of the thirteenth transistor TR13 and the seventh transistor TR7. The seventh transistor TR7 includes a control electrode connected to the thirteenth transistor TR13, an input electrode connected to the clock terminal CT, and an output electrode connected to an input electrode of the eighth transistor TR8. An output electrode of the seventh transistor TR7 is connected to the N node N.

The thirteenth transistor TR13 includes a control electrode connected to the carry node R, an input electrode connected to the twelfth transistor TR12, and an output electrode connected to the first voltage terminal VT1. The eighth transistor TR8 includes a control electrode connected to the carry node R, an input electrode connected to the N node N and an output electrode connected the first voltage terminal VT1.

During an n-th period Tn of a frame period in which a high voltage is applied to the carry node R, the inverter 270 discharges the clock signal CK received through the clock terminal CT into the first low voltage VSS1 received through the first voltage terminal VT1. That is, the eighth and thirteenth transistors TR8 and TR13 are turned on in response to a high voltage of the carry node R. Accordingly, the clock signal CK is discharged into the first low voltage VSS1.

The first holding part 281 maintains a voltage of the carry node R. The first holding part 281 may include an eleventh transistor TR11. The eleventh transistor TR11 includes a control electrode connected to the N node N, an input electrode connected to the carry node R and an output electrode connected to the second voltage terminal VT2. The first holding part 281 maintains a voltage of the carry node R to the second low voltage VSS2 in response to a voltage of the N node N during a remaining frame period except for the n-th period Tn.

The second holding part 282 maintains a voltage of the Q node Q. The second holding part 282 may include a tenth transistor TR10. The tenth transistor TR10 includes a control electrode connected to the N node N, an input electrode connected to the Q node Q, and an output electrode connected to the carry node R. The second holding part 282 maintains a voltage of the Q node Q into the second low voltage VSS2 of the carry node R in response to a high voltage VDD of the N node N during a remaining frame period except for the n-th period Tn. In addition, during the n-th period Tn in which the Q node Q connected to the drain of the tenth transistor TR10 bootstraps, the high voltage VDD of the carry node R is applied to the source of the tenth transistor TR10. A drain-source voltage of the tenth transistor TR10 is reduced, and thus, the voltage of the Q node Q is prevented or substantially prevented from being dropped by a leakage current.

The third holding part 283 maintains a voltage of the output node O. The third holding part 262 may include a third transistor TR3. The third transistor TR3 includes a control electrode connected to the N node N, an input electrode connected to the output node O, and an output electrode connected to the first voltage terminal VT1. The third holding part 262 maintains a voltage of the output node O at the first low voltage VSS1 applied to the first voltage terminal VT1 in response to a voltage of the N node N during a remaining frame period except for the n-th period Tn.

Generally, a gate-source voltage Vgs of the first transistor TR1 may be defined by a difference voltage between the Q node Q and the output node O. Noise of the gate driving circuit may occur in high temperature (e.g., become worse or more pronounced as temperature increases). For example, temperature of the display panel operating in room temperature, may be increased to about 35° C. to about 40° C. by the backlight. When the operating temperature increases, drain current of the first transistor TR1 increases and the leakage current of the first transistor TR1 may increase.

The increased leakage current is applied the Q node Q of a next stage through the fifteenth transistor TR15 of the carry part 240. Therefore, the first transistor TR1 of the next stage is bootstrapped in a different period form a period during the next stage is driven, and thus, the noise of the gate driving circuit may occur.

According to one exemplary embodiment, when the gate driving circuit is driven while the display panel is operating at high temperature, the voltage of the Q node Q may be maintained at the second low voltage VSS2 by the eleventh transistor TR11 of the first holding part 281 and the tenth transistor TR10 of the second holding part 282, which are turned on in response to the inverting signal of the inverter 270 in synchronization with the clock signal CK.

In addition, referring to the n-th period Tn during which the Q node Q is bootstrapped, the gate of the tenth transistor TR10 receives the first low voltage VSS1 of the N node N, the drain of the tenth transistor TR10 receives the bootstrap voltage VBT, and the source of the tenth transistor TR10 receives the high voltage VDD of the carry signal CRn. The drain-source voltage Vds of the tenth transistor TR10 may be reduced, and thus, the leakage current of the tenth transistor TR10 due to the Kink phenomenon may be avoided or substantially reduced. In the n-th period Tn, the leakage current may be avoided or substantially reduced and then the bootstrap voltage VBT is prevented from being dropped (or the drop is substantially reduced).

Therefore, the n-th gate signal Gn outputted from the n-th stage SRCn may be prevented from being distorted (or any distortions are substantially reduced).

Hereafter, a method of driving the tenth transistor TR10 will be described in greater detail referring to FIGS. 5, 6A and 6B.

Figure 5:
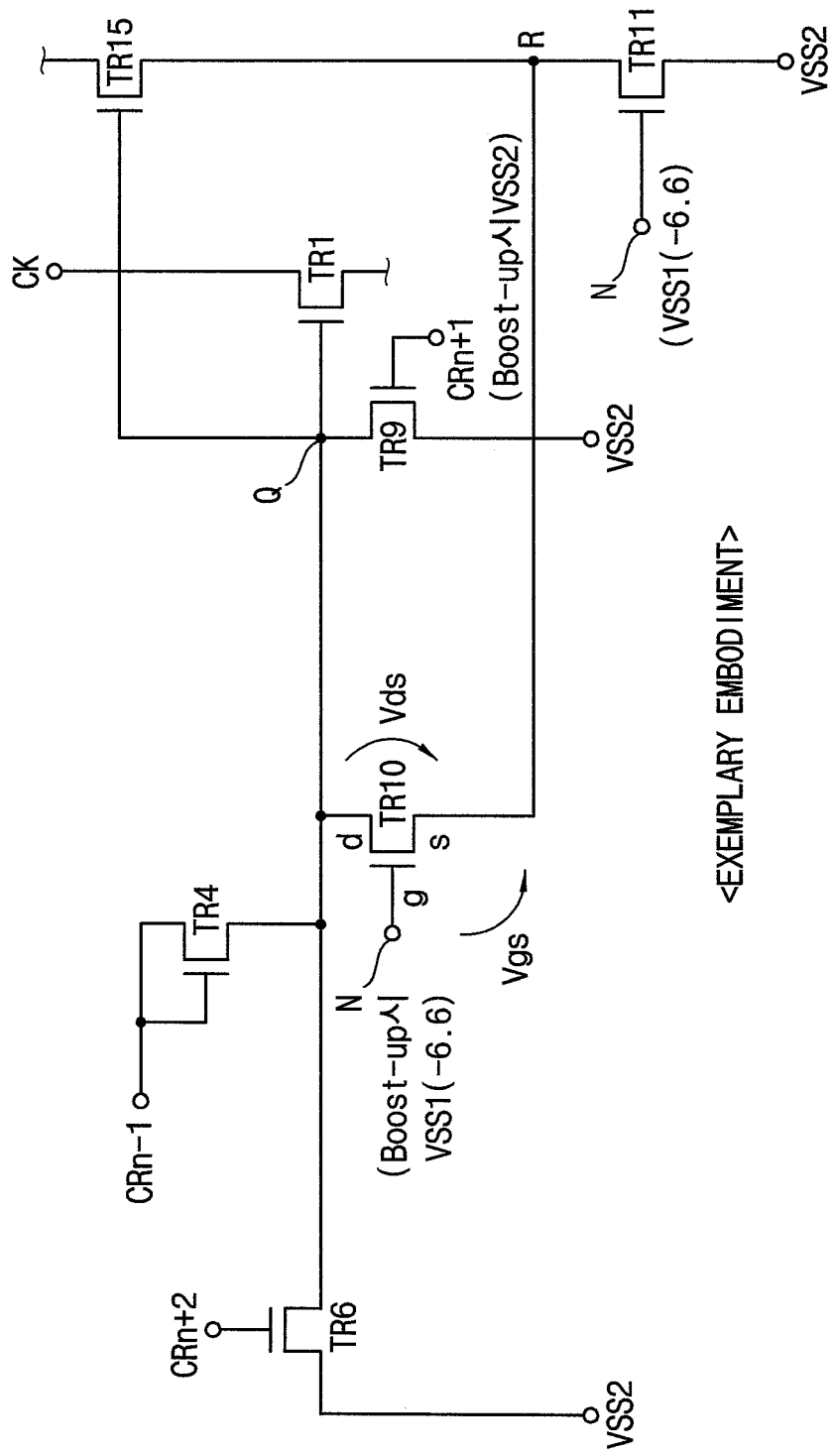
FIG. 5 is a circuit diagram illustrating a method of driving a tenth transistor according to one exemplary embodiment.
Figure 6A:
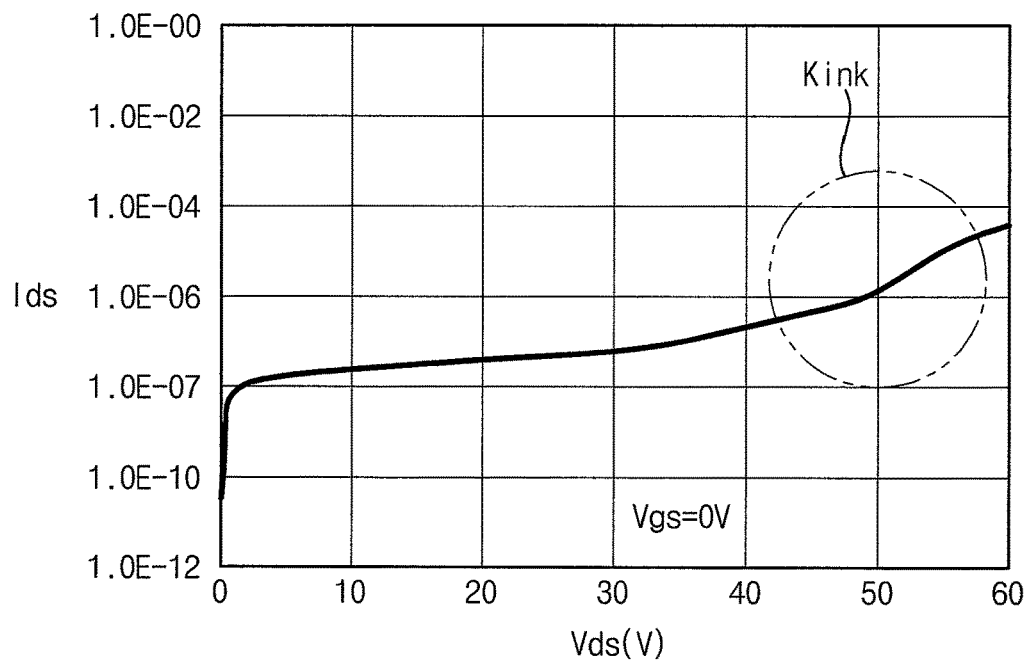
FIGS. 6A and 6B are graph diagrams illustrating V-I of a transistor.
Figure 6B:
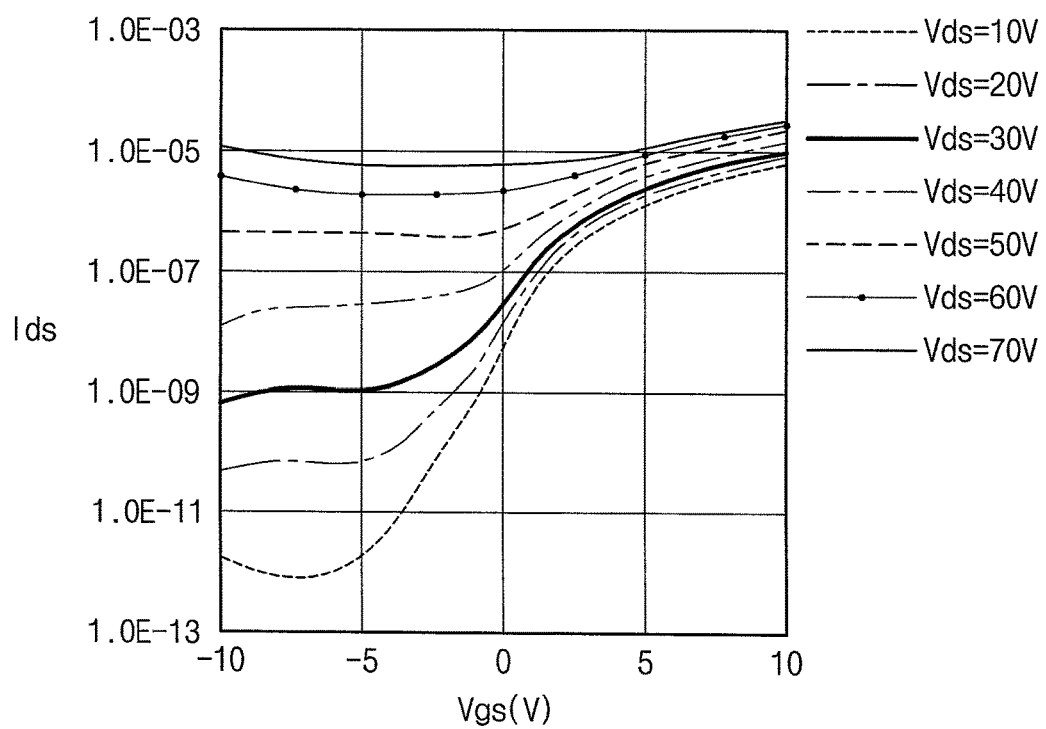

FIG. 5 is a circuit diagram illustrating a method of driving a tenth transistor according to one exemplary embodiment. FIGS. 6A and 6B are graph diagrams illustrating voltage to current (V-I) characteristic of a transistor.

Referring to FIGS. 4 and 5, the gate g of the tenth transistor TR10 is connected to the N node N, the drain d of the tenth transistor TR10 is connected to the Q node Q and the source s of the tenth transistor TR10 is connected to the carry node R.

Referring to the n-th period Tn when the Q node Q is bootstrapped, the gate g of the tenth transistor TR10 receives the first low voltage (VSS1=−6.6 V, for example) of the N node, the drain d of the tenth transistor TR10 receives the bootstrap voltage (VBT=+60 V, for example), and the source s of the tenth transistor TR10 receives the high voltage (VDD=+30 V, for example) of the n-th carry signal CRn.

Therefore, according to the exemplary embodiment, the gate-source voltage Vgs of the tenth transistor TR10 is about 36 V and the drain-source voltage Vds of the tenth transistor TR10 is about +30 V.

Referring to FIGS. 5A and 5B, the Kink phenomenon is a phenomenon in which a drain current Ids increases sharply when a high drain-source voltage Vds is applied to the transistor.

During the n-th period Tn during which the Q node Q is bootstrapped, the tenth transistor TR10 according to the exemplary embodiment has a low drain-source voltage Vds and a low gate-source voltage Vgs, and thus, the kink leakage current (i.e., the leakage current due to the kink effect) is made stable. Therefore, according to the exemplary embodiment, the kink leakage current may be avoided or substantially reduced and distortion of the n-th gate signal Gn may be avoided or substantially reduced.

Figure 7A:
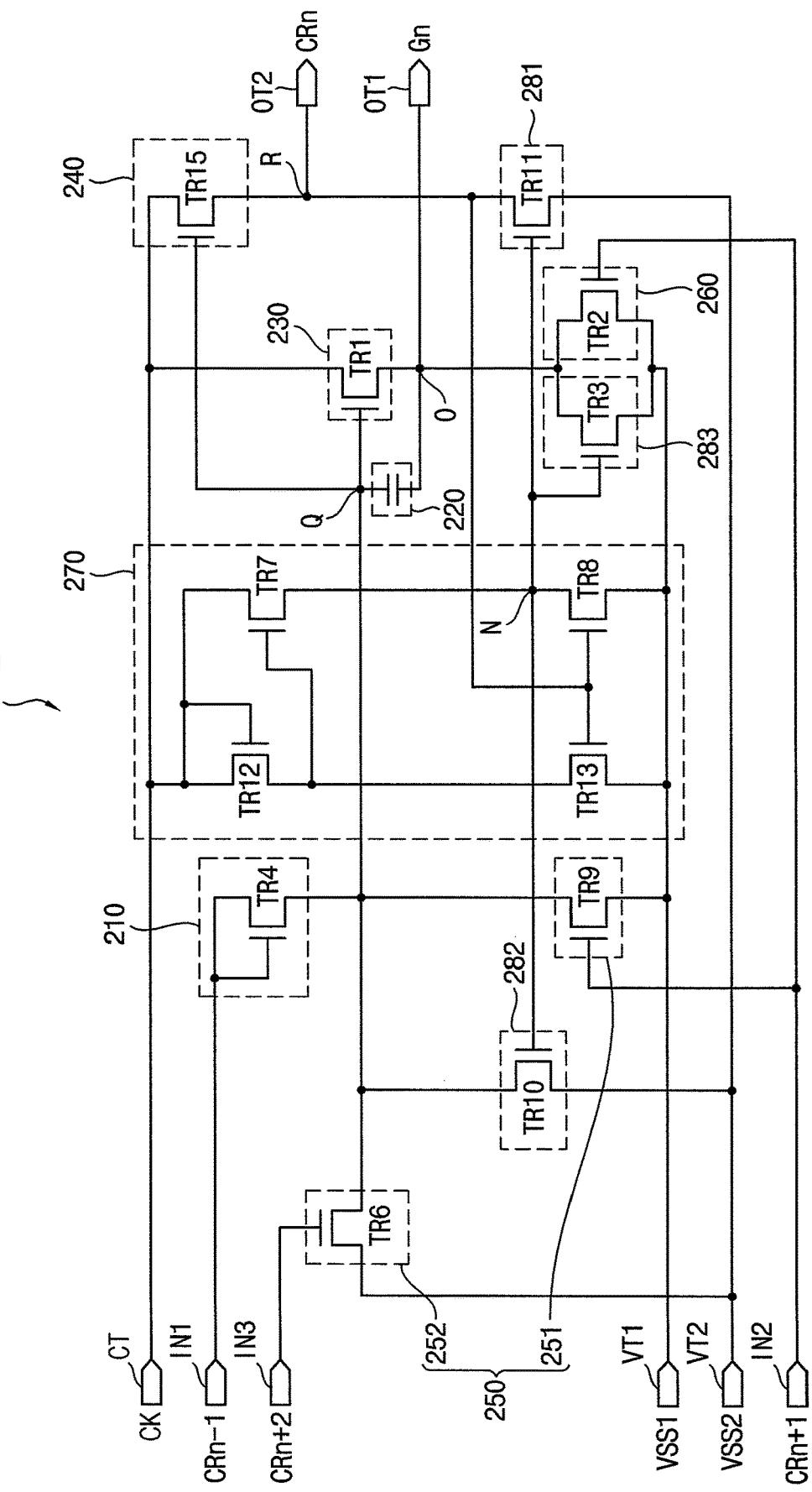
FIG. 7A is a circuit diagram illustrating a stage according to one comparative exemplary embodiment.
Figure 7B:
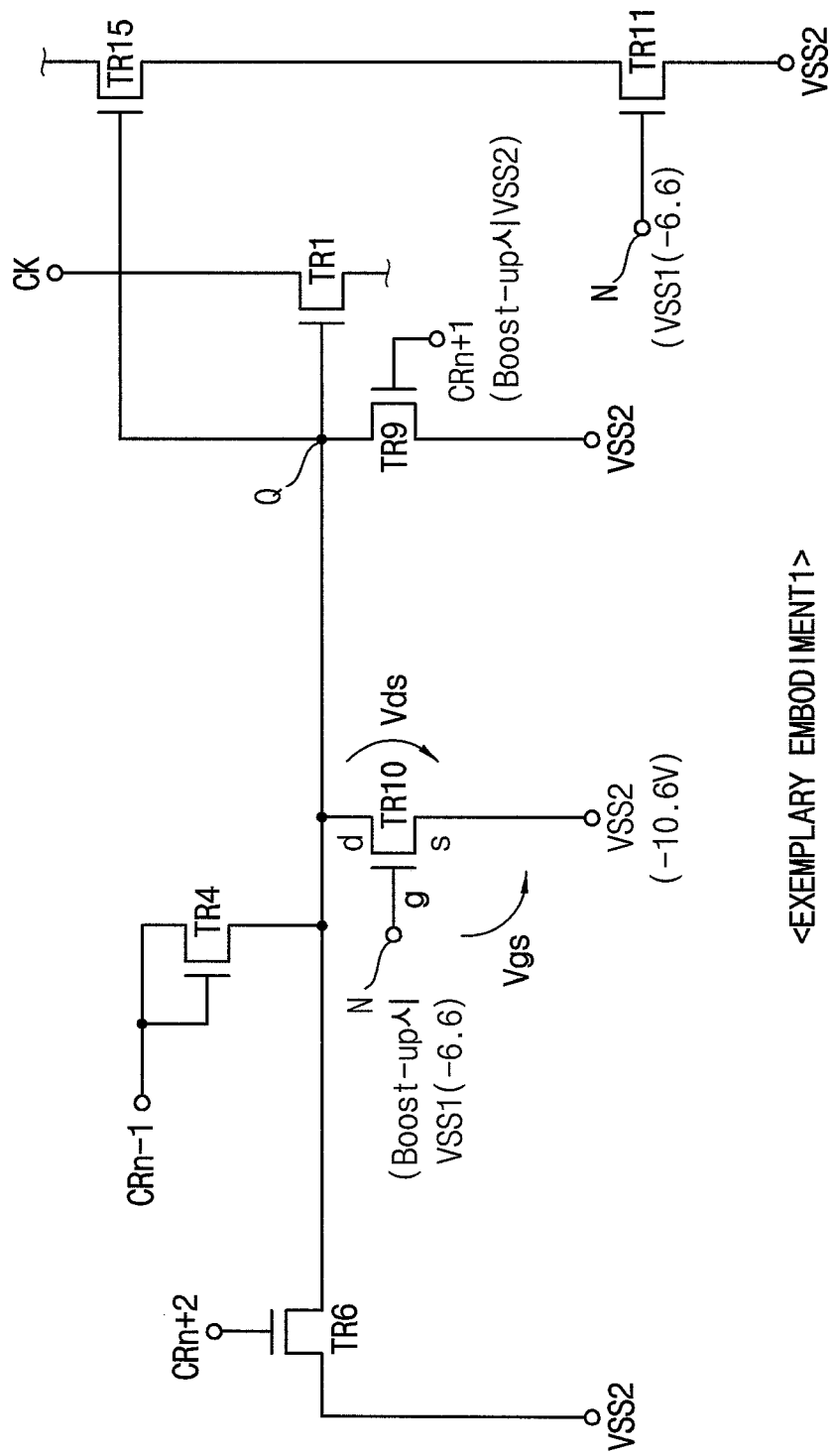
FIG. 7B is a circuit diagram illustrating a method of driving a tenth transistor of FIG. 7A.

FIG. 7A is a circuit diagram illustrating a stage according to one comparative exemplary embodiment. FIG. 7B is a circuit diagram illustrating a method of driving a tenth transistor of FIG. 7A.

Referring to FIGS. 7A and 7B, according to one comparative exemplary embodiment, an n-th stage SRCn_1 includes a tenth transistor TR10.

According to one comparative exemplary embodiment, a gate g of the tenth transistor TR10 is connected to the N node N, a drain d of the tenth transistor TR10 is connected to the Q node Q, and a source s of the tenth transistor TR10 receives the second low voltage VSS2.

Referring to the n-th period Tn when the Q node Q is bootstrapped, the gate g of the tenth transistor TR10 receives the first low voltage (VSS1=−6.6 V, for example) of the N node, the drain d of the tenth transistor TR10 receives the bootstrap voltage (VBT=+60 V, for example), and the source s of the tenth transistor TR10 receives the second low voltage (VSS2=−10.6 V, for example).

Therefore, according to one comparative exemplary embodiment, the gate-source voltage Vgs of the tenth transistor TR10 is about +4 V and the drain-source voltage Vds of the tenth transistor TR10 is about +70 V.

Referring to FIGS. 7A and 7B, the tenth transistor TR10 according to one comparative exemplary embodiment has a high drain-source voltage Vds and a high gate-source voltage Vgs, and thus, the drain current Ids increases sharply due to the Kink phenomenon. Therefore, according to one comparative exemplary embodiment, the kink leakage current may increase sharply during the n-th period Tn.

Therefore, according to one comparative exemplary embodiment, distortion of the n-th gate signal Gn may be increased.

Figure 8A:
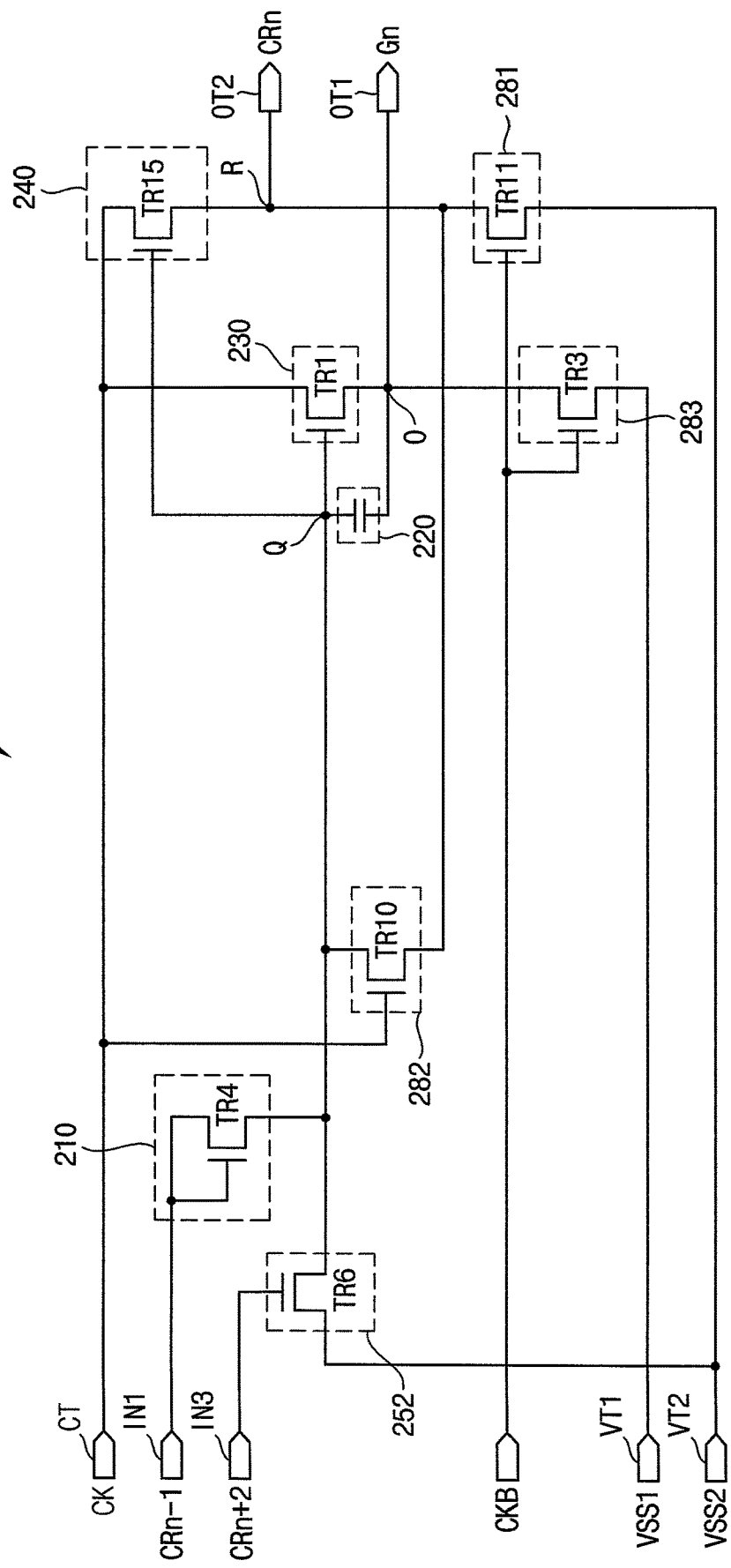
FIG. 8A is a circuit diagram illustrating a stage according to another comparative exemplary embodiment.
Figure 8B:
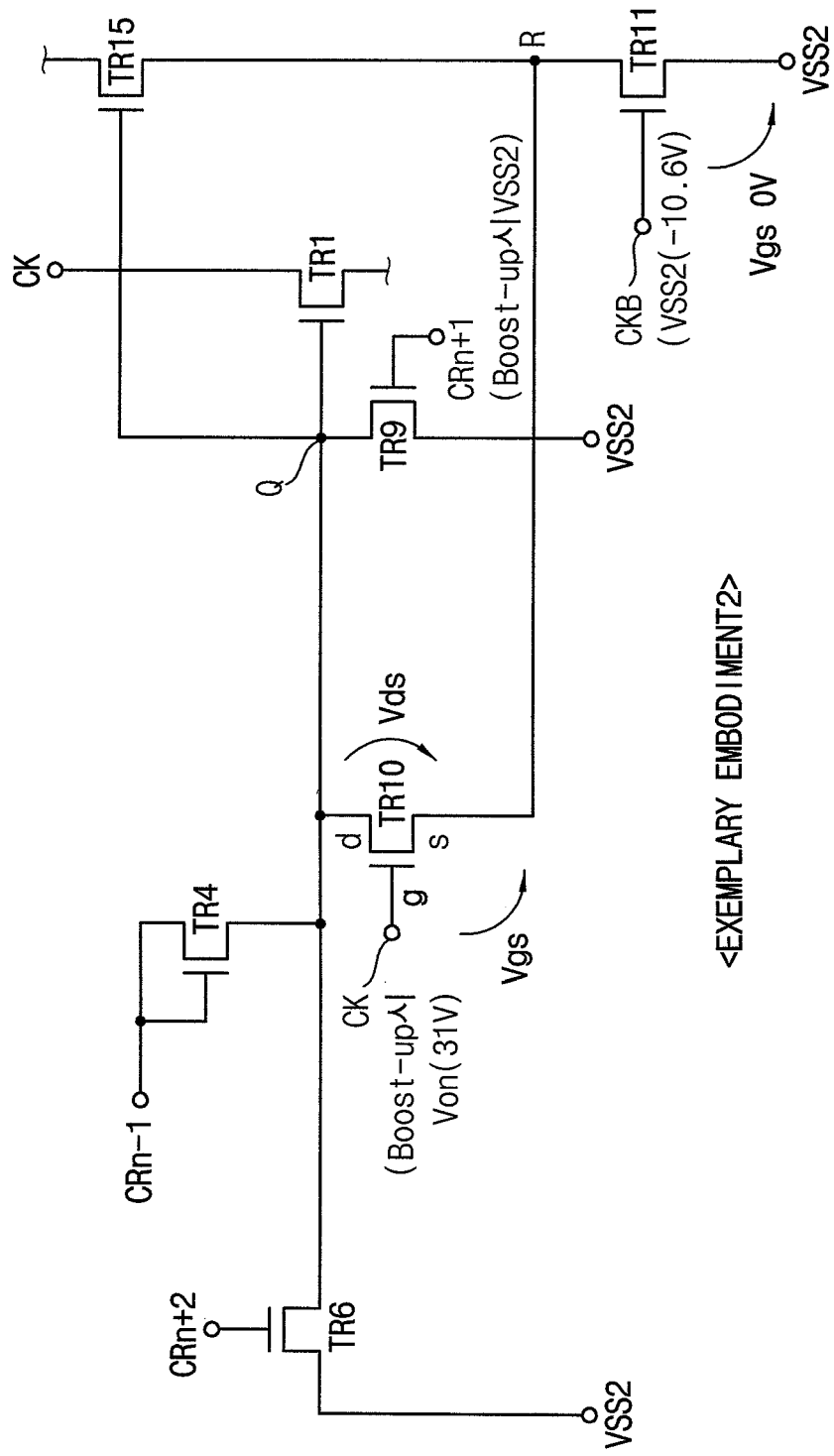
FIG. 8B is a circuit diagram illustrating a method of driving a tenth transistor of FIG. 8A.

FIG. 8A is a circuit diagram illustrating a stage according to another comparative exemplary embodiment. FIG. 8B is a circuit diagram illustrating a method of driving a tenth transistor of FIG. 8A.

Referring to FIG. 8A, according to another comparative exemplary embodiment, an n-th stage SRCn_2 includes a tenth transistor TR10.

According to another comparative exemplary embodiment, a gate g of the tenth transistor TR10 receives the clock signal CK, a drain d of the tenth transistor TR10 is connected to the Q node Q, and a source s of the tenth transistor TR10 is connected to the carry node R.

Referring to the n-th period Tn when the Q node Q is bootstrapped, the gate g of the tenth transistor TR10 receives the high voltage (VDD=+30 V, for example) of the clock signal CK, the drain d of the tenth transistor TR10 receives the bootstrap voltage (VBT=+60 V, for example), and the source s of the tenth transistor TR10 receives the high voltage (VDD=+30 V, for example) of the n-th carry signal CRn.

Therefore, according to another comparative exemplary embodiment, the gate-source voltage Vgs of the tenth transistor TR10 is about 0 V and the drain-source voltage Vds of the tenth transistor TR10 is about +30 V.

Referring to FIGS. 8A and 8B, the tenth transistor TR10 according to another comparative exemplary embodiment has a low drain-source voltage Vds and a low gate-source voltage Vgs such as those of the tenth transistor TR10 according to the exemplary embodiment. Therefore, according to another comparative exemplary embodiment, the kink leakage current may be avoided or substantially reduced and distortion of the n-th gate signal Gn may be avoided or substantially reduced.

However, the tenth transistor according to another comparative exemplary embodiment has the gate-source voltage Vgs higher than that of the tenth transistor TR10 according to the exemplary embodiment, and thus, the leakage of another comparative exemplary embodiment is increased more than that of the exemplary embodiment.

Figure 9:
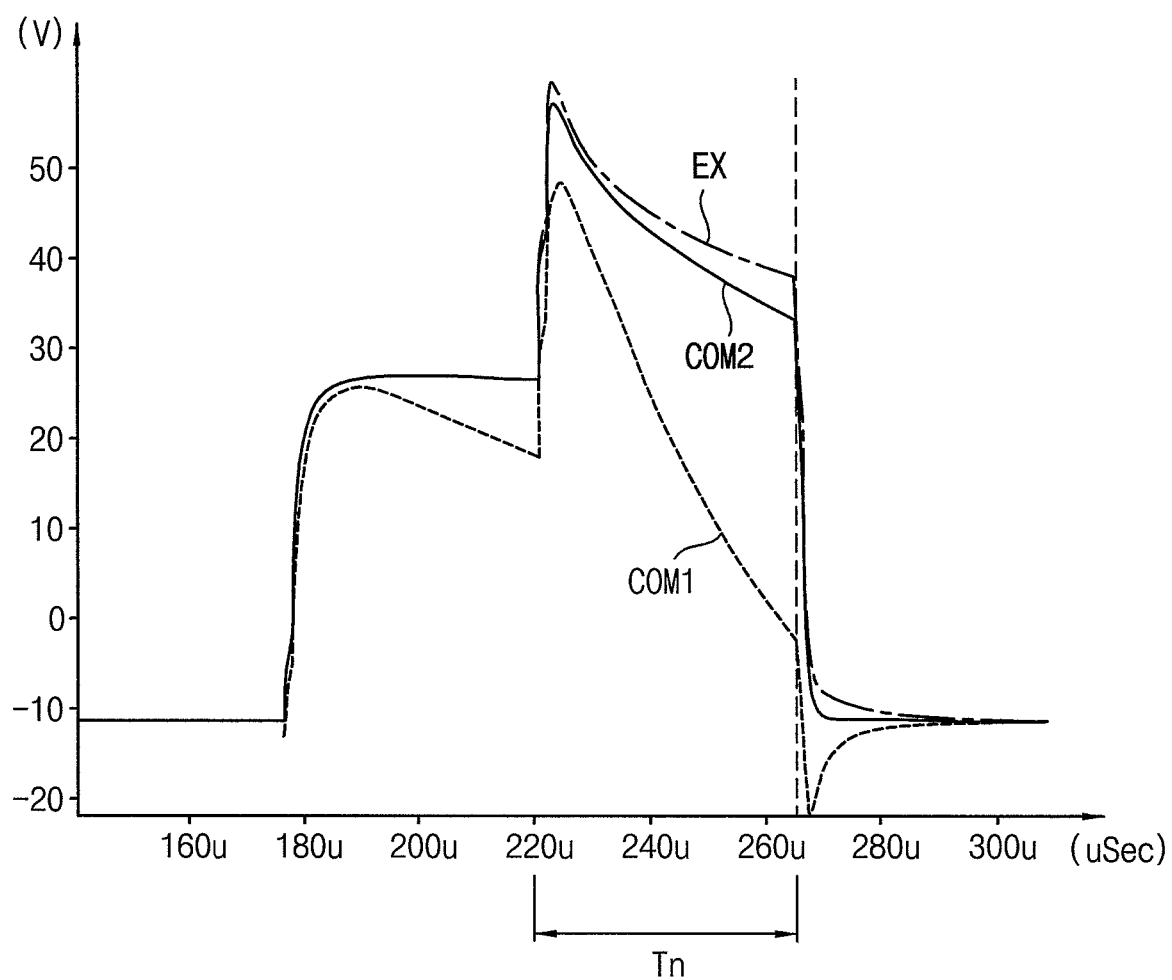
FIG. 9 is waveform diagram showing voltages applied to control nodes according to the exemplary embodiment and the comparative exemplary embodiment.

FIG. 9 is waveform diagram showing voltages applied to control nodes according to the exemplary embodiment and the comparative exemplary embodiment.

FIG. 9 is a waveform diagram of measuring a voltage applied to the Q node by the kink leakage current when an initialization threshold voltage Vth of the tenth transistor is about −5 V.

Referring to FIG. 9, according to one comparative exemplary embodiment, leakage current of the tenth transistor is increased due to the Kink phenomenon, and thus, the bootstrap voltage COM1 of the Q node drops sharply.

According to another comparative exemplary embodiment, the leakage current of the tenth transistor due to the Kink phenomenon occur a little and the bootstrap voltage COM2 of the Q node is less decrease than the bootstrap voltage COM1 of one comparative exemplary embodiment.

According to one exemplary embodiment, the leakage current of the tenth transistor due to the Kink phenomenon does not occur and the bootstrap voltage EX of the Q node is less decrease than the bootstrap voltage COM2 of another comparative exemplary embodiment.

Figure 10:
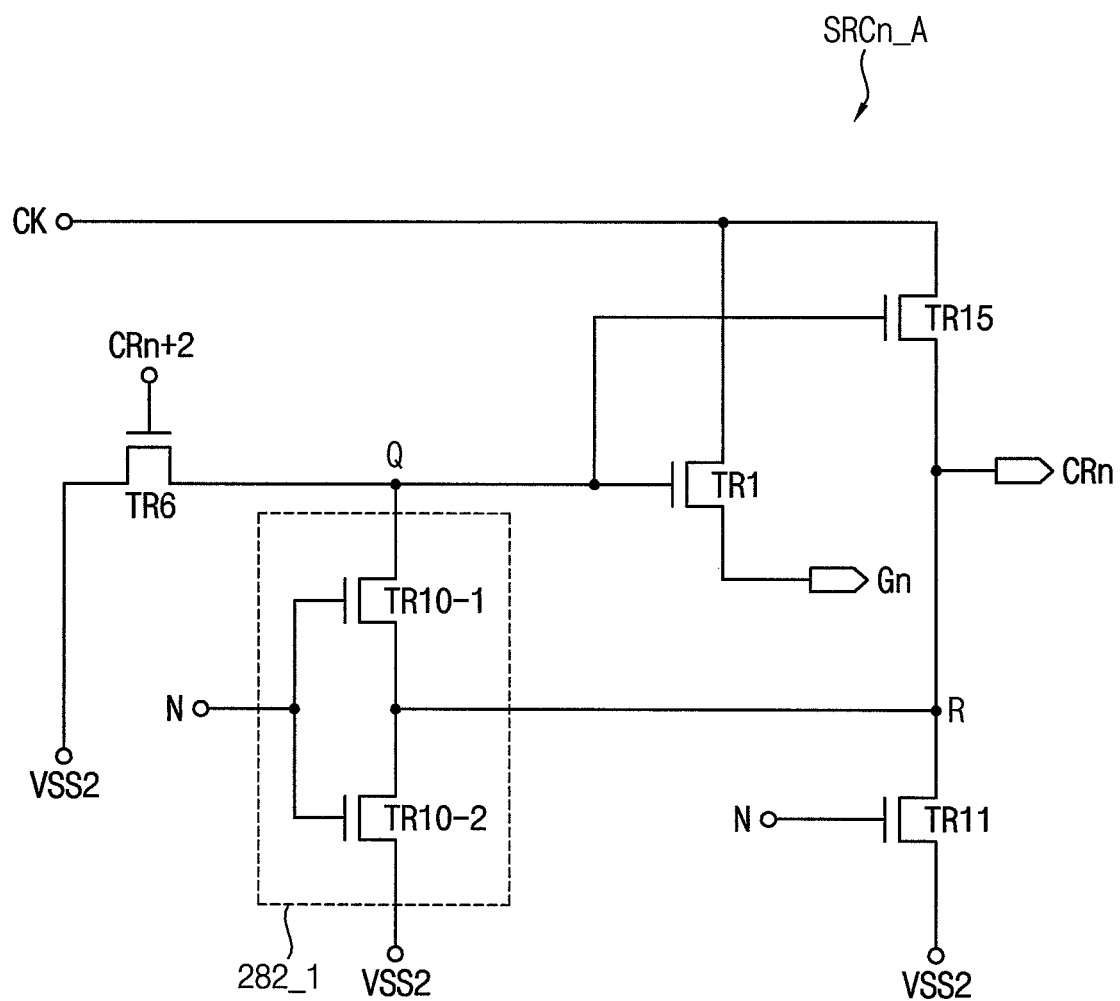
FIG. 10 is a partial circuit diagram illustrating a stage according to one exemplary embodiment.

FIG. 10 is a partial circuit diagram illustrating a stage according to one exemplary embodiment.

Referring to FIG. 10, an n-th stage SRCn_A according to one exemplary embodiment is the same as that of the previous exemplary embodiment described referring to FIG. 5 except for a second holding part 282_1. Hereinafter, the same reference numerals are used to refer to the same or like parts as those described in the previous exemplary embodiments, and the same detailed explanations may not be repeated.

The second holding part 282_1 includes a sixteenth transistor TR10-1 and a seventeenth transistor TR10-2.

The sixteenth transistor TR10-1 includes a control electrode connected to the N node N, an input electrode connected to the Q node Q and an output electrode connected to the carry node R. The seventeenth transistor TR10-2 includes a control electrode connected to the N node N, an input electrode connected to the carry node R and an output electrode receiving the second low voltage VSS2. The output electrode of the sixteenth transistor TR10-1 is connected to the carry node R and the input electrode of the seventeenth transistor TR10-2 is connected to the carry node R.

Referring to FIG. 4, during the n-th period Tn in which the Q node Q is bootstrapped, a drain-source voltage Vds of the first the second holding part 282_1 is divide between the sixteenth and seventeenth transistors TR10-1 and TR10-2, and thus, the kink leakage current is controlled.

In addition, during the frame period except for the n-th period Tn, the sixteenth and seventeenth transistors TR10-1 and TR10-2 directly apply the second low voltage VSS2 to the Q node Q, and thus, the second low voltage VSS2 applied to the Q node Q is stably maintained.

Figure 11:
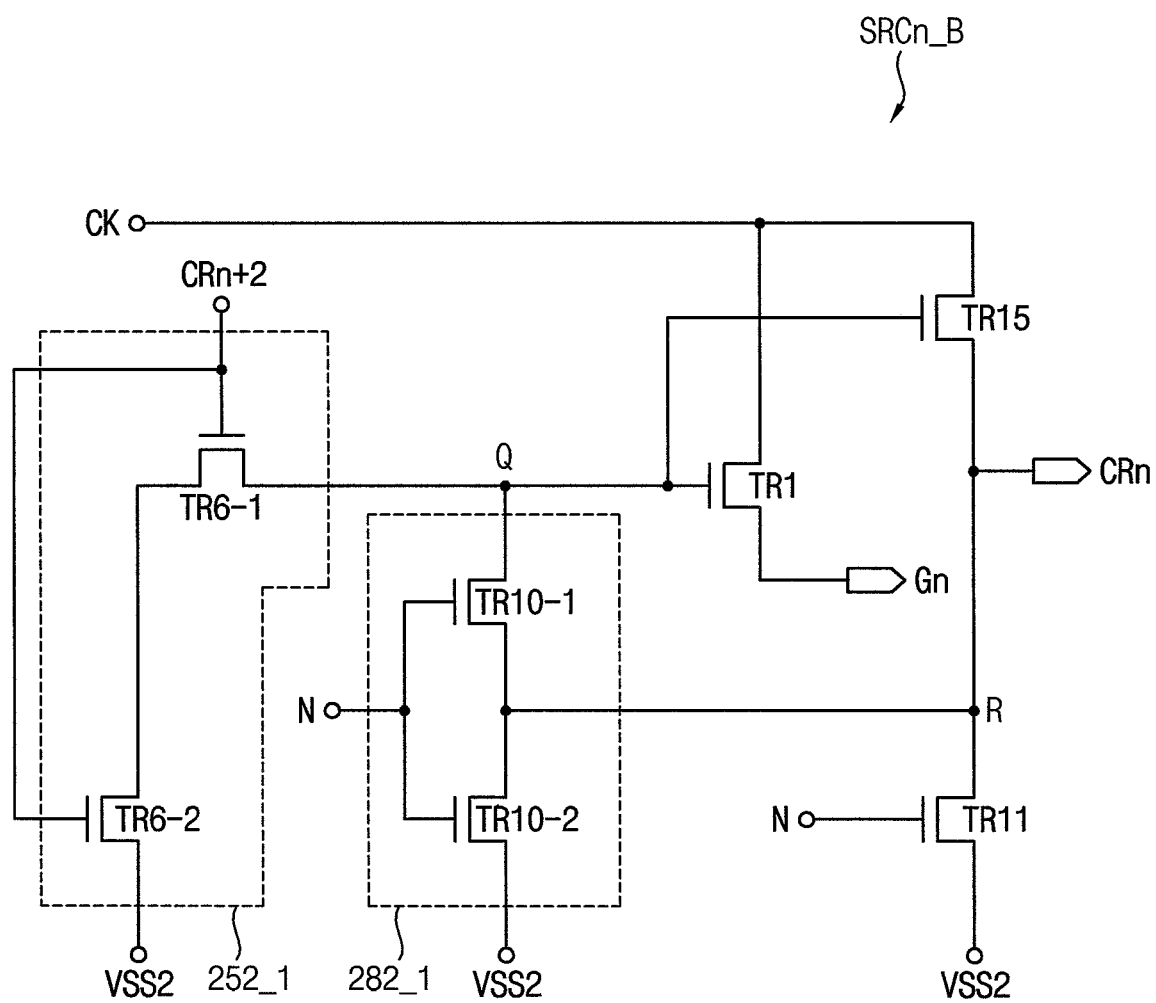
FIG. 11 is a partial circuit diagram illustrating a stage according to one exemplary embodiment.

FIG. 11 is a partial circuit diagram illustrating a stage according to one exemplary embodiment.

Referring to FIG. 11, an n-th stage SRCn_B according to one exemplary embodiment is the same as that of the previous exemplary embodiment described referring to FIG. 5 except for a second holding part 282_1 and a second discharging part 252_1. Hereinafter, the same reference numerals are used to refer to the same or like parts as those described in the previous exemplary embodiments, and the same detailed explanations may not be repeated.

The second holding part 282_1 includes a sixteenth transistor TR10-1 and a seventeenth transistor TR10-2. In an n-th period Tn in which the Q node Q is bootstrapped, a drain-source voltage Vds of the second holding part 282_1 is divided between the sixteenth and seventeenth transistors TR10-1 and TR10-2, and thus, the kink leakage current is controlled. In addition, during the frame period except for the n-th period Tn, the sixteenth and seventeenth transistors TR10-1 and TR10-2 directly apply the second low voltage VSS2 to the Q node Q, and thus, the second low voltage VSS2 applied to the Q node Q is stably maintained.

The second discharging part 252_1 includes an eighteenth transistor TR6-1 and a nineteenth transistor TR6-2.

The eighteenth transistor TR6-1 includes a control electrode receiving the (n+2)-th carry signal CRn+2, an input electrode connected to the Q node Q, and an output electrode connected to the carry node R. The nineteenth transistor TR6-2 includes a control electrode receiving the (n+2)-th carry signal CRn+2, an input electrode connected to the carry node R, and an output electrode receiving the second low voltage VSS2. The output electrode of the eighteenth transistor TR6-1 is connected to the carry node R, and the input electrode of the nineteenth transistor TR6-2 is connected to the carry node R.

In n-th period Tn in which the Q node Q is bootstrapped, a drain-source voltage Vds of the second discharging part 252_1 is divided between the eighteenth and nineteenth transistors TR6-1 and TR6-2, and thus, the kink leakage current is controlled. In addition, during the frame period except for the n-th period Tn, the eighteenth and nineteenth transistors TR6-1 and TR6-2 directly apply the second low voltage VSS2 to the Q node Q, and thus, a voltage of the Q node Q is discharged into the second low voltage VSS2.

Figure 12:
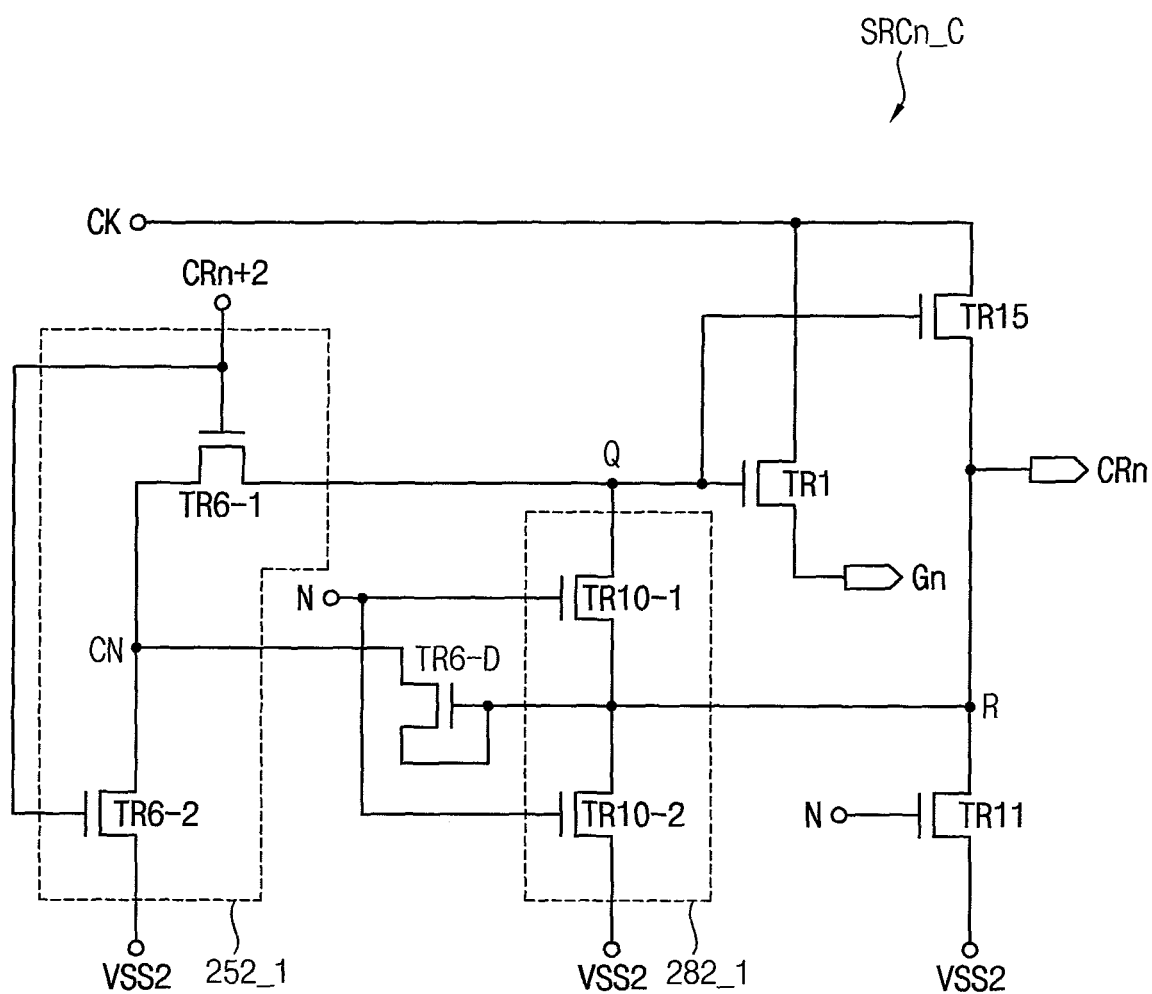
FIG. 12 is a partial circuit diagram illustrating a stage according to one exemplary embodiment.

FIG. 12 is a partial circuit diagram illustrating a stage according to one exemplary embodiment.

Referring to FIG. 12, an n-th stage SRCn_C according to one exemplary embodiment is the same or substantially the same as that of the previous exemplary embodiment described referring to FIG. 5, except for a second holding part 282_1, a second discharging part 252_1, and a diode TR6_D. Hereinafter, the same reference numerals are used to refer to the same or like parts as those described in the previous exemplary embodiments, and the detailed explanation of the same or like partss may not be repeated.

The second holding part 282_1 includes a sixteenth transistor TR10-1 and a seventeenth transistor TR10-2. In an n-th period Tn in which the Q node Q is bootstrapped, a drain-source voltage Vds of the first the second holding part 282_1 is divide between the sixteenth and seventeenth transistors TR10-1 and TR10-2, and thus, the kink leakage current is controlled. In addition, during the frame period except for the n-th period Tn, the sixteenth and seventeenth transistors TR10-1 and TR10-2 directly apply the second low voltage VSS2 to the Q node Q, and thus, the second low voltage VSS2 applied to the Q node Q is stably maintained.

The second discharging part 252_1 includes an eighteenth transistor TR6-1 and a nineteenth transistor TR6-2. In an n-th period Tn in which the Q node Q is bootstrapped, a drain-source voltage Vds of the second discharging part 252_1 is divided between the eighteenth and nineteenth transistors TR6-1 and TR6-2, and thus, the kink leakage current is controlled. In addition, during the frame period except for the n-th period Tn, the eighteenth and nineteenth transistors TR6-1 and TR6-2 directly apply the second low voltage VSS2 to the Q node Q, and thus, a voltage of the Q node Q is discharged into the second low voltage VSS2.

The diode TR6-D is connected to the carry node R and a connection node CN that is connected to the eighteenth and nineteenth transistors TR6-1 and TR6-2. The diode TR6-D decreases the leakage current occurring through the eighteenth and nineteenth transistors TR6-1 and TR6-2 in the n-th period Tn in which the Q node Q is bootstrapped.

Figure 13:
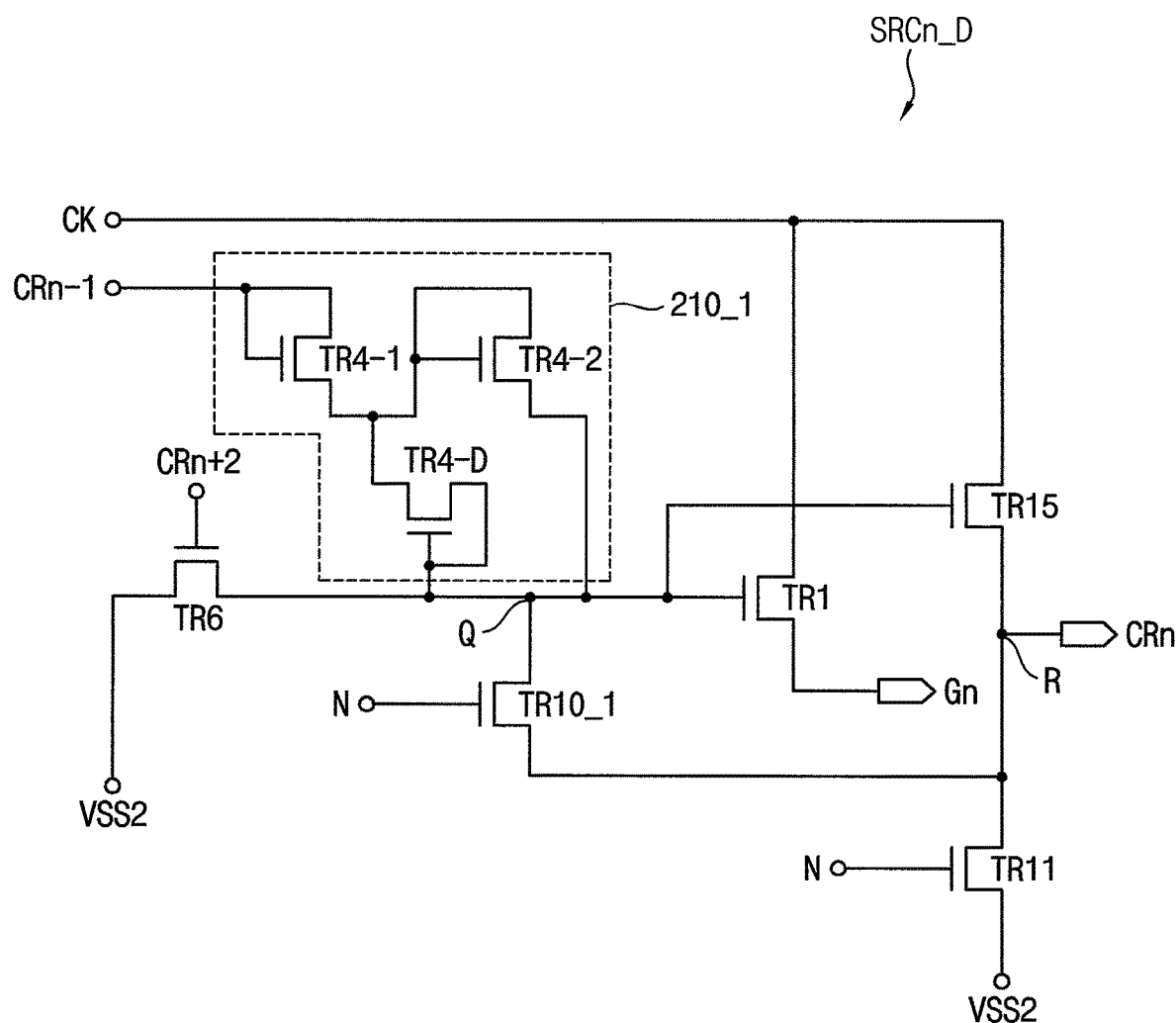
FIG. 13 is a partial circuit diagram illustrating a stage according to one exemplary embodiment.

FIG. 13 is a partial circuit diagram illustrating a stage according to one exemplary embodiment.

Referring to FIG. 13, an n-th stage SRCn_D according to one exemplary embodiment is the same or substantially the same as that of the previous exemplary embodiment described referring to FIG. 5 except for a buffer part 210_1. Hereinafter, the same reference numerals are used to refer to the same or like parts as those described in the previous exemplary embodiments, and the detailed explanations of the same or like parts may not be repeated.

The buffer part 210_1 includes a twentieth transistor TR4-1, a 21st transistor TR4-2, and a diode TR4-D.

The twentieth transistor TR4-1 includes control and input electrodes receiving an (n−1)-th carry signal CRn−1 and an output electrode connected to the 21st transistor TR4-2.

The 21st transistor TR4-2 includes control and input electrodes connected to the output electrode of the twentieth transistor TR4-1 and an output electrode connected to the Q node Q.

The diode TR4-D is connected between the Q node Q and a connection node CN that is connected to the twentieth and 21st transistors TR4-1 and TR4-2. The diode TR4-D decreases the leakage current occurring through the twentieth and 21st transistors TR4-1 and TR4-2 in the n-th period Tn in which the Q node Q is bootstrapped.

According to the exemplary embodiments, when the gate driving circuit is driven while the display panel is operating at high temperature, the voltage of the control node may be maintained at the second low voltage in response to the output signal of the inverter. In addition, in the n-th period in which the control node is bootstrapped, the kink leakage current is avoided or substantially reduced and thus the bootstrap voltage of the control node is prevented from being dropped (or the drop is substantially reduced). Therefore, distortion of the gate signal may be avoided or substantially reduced.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, or the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of the inventive concept and is not to be construed as limiting thereof. Although a few exemplary embodiments of the inventive concept have been described, those skilled in the art will readily appreciate that many suitable modifications are possible in the exemplary embodiments without materially departing from the novel teachings and aspects of the inventive concept. Accordingly, all such modifications are intended to be included within the scope of the inventive concept as defined by the claims and equivalents thereof.

What is claimed is:

1. A gate driving circuit comprising a plurality of stages cascade-connected with each other and configured to output a plurality of gate signals, an n-th stage ('n' being a natural number greater than one) of the plurality of stages comprising:
   a pull-up circuit configured to output a high voltage of a clock signal as a high voltage of an n-th gate signal in response to a bootstrap voltage of a control node in an n-th period of a frame period;
   a first discharging circuit configured to discharge a voltage of the control node to a first low voltage in response to a carry signal of at least one stage of the plurality of stages that is subsequent to the n-th stage;
   a second discharging circuit configured to discharge a voltage of the control node to a second low voltage being lower than the first low voltage in response to a carry signal of at least one stage of the plurality of stages that is subsequent to the n-th stage;
   a carry circuit configured to output the high voltage of the clock signal as a high voltage of an n-th carry signal in response to the bootstrap voltage of the control node;
   an inverter configured to output an inverting signal in synchronization with the clock signal during the frame period except for the n-th period;
   a first holding circuit configured to maintain the n-th carry signal to the second low voltage in response to a high voltage of the inverting signal; and
   a second holding circuit configured to maintain a voltage of the control node to the second low voltage of the n-th carry signal in response to the high voltage of the inverting signal, the second holding circuit being directly connected to the first holding circuit at an output terminal configured to output the n-th carry signal.

2. The gate drive circuit of claim 1, wherein the first discharging circuit is configured to discharge a voltage of the control node to the first low voltage in response to a high voltage of an (n+1)-th carry signal.

3. The gate drive circuit of claim 2, wherein the second discharging circuit is configured to discharge a voltage of the control node to the second low voltage in response to a high voltage of an (n+2)-th carry signal.

4. The gate drive circuit of claim 3, further comprising:
   a pull-down circuit configured to pull-down a high voltage of an n-th gate signal to a first low voltage in response to a carry signal of the at least one stage of the plurality of stages that is subsequent to the n-th stage.

5. The gate drive circuit of claim 4, further comprising:
   a third holding circuit configured to maintain the n-th gate signal at the first low voltage in response to the high voltage of the inverting signal.

6. The gate drive circuit of claim 5, further comprising:
   a buffer circuit configured to provide a high voltage of an (n−1)-th carry signal to a capacitor connected to the control node, wherein the capacitor provides the bootstrap voltage to the control node in response to the high voltage of the clock signal in the n-th period.

7. The gate drive circuit of claim 6, wherein the second holding circuit comprises:
a sixteenth transistor comprising a control electrode configured to receive the inverting signal, a first electrode connected to the control node, and a second electrode connected to the carry circuit; and
a seventeenth transistor comprising a control electrode configured to receive the inverting signal, a first electrode connected to the second electrode of the sixteenth transistor, and a second electrode configured to receive the second low voltage.

8. The gate drive circuit of claim 6, wherein the second discharging circuit comprises:
an eighteenth transistor comprising a control electrode configured to receive the (n+2)-th carry signal, a first electrode connected to the control node, and a second electrode indirectly connected to the carry circuit; and
a nineteenth transistor comprising a control electrode configured to receive the (n+2)-th carry signal, a first electrode connected to the second electrode of the eighteenth transistor, and a second electrode configured to receive the second low voltage,
wherein a connection node is connected between the eighteenth and nineteenth transistors and the connection node is indirectly connected to the carry circuit.

9. The gate drive circuit of claim 8, wherein the second discharging circuit further comprises a diode connected between the connection node and the carry circuit.

10. The gate drive circuit of claim 8, wherein the buffer circuit comprises:
a twentieth transistor comprising a control electrode and a first electrode configured to receive the (n−1)-th carry signal;
a 21st transistor comprising a control electrode and a first electrode connected to a second electrode of the twentieth transistor and a second electrode connected to the control node; and
a diode connected to the control node and a connection node, the connection node being connected between the twentieth and 21st transistors and the control node.

11. A display apparatus comprising:
a display panel comprising a display area on which gate lines and data lines crossing the gate line are arrayed to display an image, and further comprising a peripheral area surrounding the display area;
a data drive circuit configured to output data signals to the data lines; and
a gate drive circuit comprising a shift register in which a plurality of stages are connected one after another to each other, an n-th stage of the plurality of stages ('n' being a natural number greater than one) comprising:
a pull-up circuit configured to output a high voltage of a clock signal as a high voltage of an n-th gate signal in response to a bootstrap voltage of a control node in an n-th period of a frame period;
a first discharging circuit configured to discharge a voltage of the control node to a first low voltage in response to a carry signal of at least one stage of the plurality of stages that is subsequent to the n-th stage;
a second discharging circuit configured to discharge a voltage of the control node to a second low voltage being lower than the first low voltage in response to a carry signal of at least one stage of the plurality of stages that is subsequent to the n-th stage;
a carry circuit configured to output the high voltage of the clock signal as a high voltage of an n-th carry signal in response to the bootstrap voltage of the control node;
an inverter configured to output an inverting signal in synchronization with the clock signal during the frame period except for the n-th period;
a first holding circuit configured to maintain the n-th carry signal at the second low voltage in response to a high voltage of the inverting signal; and
a second holding circuit configured to maintain a voltage of the control node at the second low voltage of the n-th carry signal in response to the high voltage of the inverting signal, the second holding circuit being directly connected to the first holding circuit at an output terminal configured to output the n-th carry signal.

12. The display apparatus of claim 11, wherein the first discharging circuit is configured to discharge a voltage of the control node to the first low voltage in response to a high voltage of an (n+1)-th carry signal.

13. The display apparatus of claim 12, wherein the second discharging circuit is configured to discharge a voltage of the control node to the second low voltage in response to a high voltage of an (n+2)-th carry signal.

14. The display apparatus of claim 13, wherein the n-th stage further comprises:
a pull-down circuit configured to pull-down a high voltage of an n-th gate signal to a first low voltage in response to a carry signal of the at least one stage of the plurality of stages that is subsequent to the n-th stage.

15. The display apparatus of claim 14, wherein the n-th stage further comprises:
a third holding circuit configured to maintain the n-th gate signal at the first low voltage in response to the high voltage of the inverting signal.

16. The display apparatus of claim 15, wherein the n-th stage further comprises a buffer circuit configured to provide a capacitor connected to the control node with a high voltage of an (n−1)-th carry signal, and
wherein the capacitor is configured to provide the control node with the bootstrap voltage in response to the high voltage of the clock signal in the n-th period.

17. The display apparatus of claim 16, wherein the second holding circuit comprises:
a sixteenth transistor comprising a control electrode configured to receive the inverting signal, a first electrode connected to the control node, and a second electrode connected to the carry circuit; and
a seventeenth transistor comprising a control electrode configured to receive the inverting signal, a first electrode connected to the second electrode of the sixteenth transistor, and a second electrode configured to receive the second low voltage.

18. The display apparatus of claim 16, wherein the second discharging circuit comprises:
an eighteenth transistor comprising a control electrode configured to receive the (n+2)-th carry signal, a first electrode connected to the control node, and a second electrode indirectly connected to the carry circuit; and
a nineteenth transistor comprising a control electrode configured to receive the (n+2)-th carry signal, a first electrode connected to the second electrode of the eighteenth transistor, and a second electrode configured to receive the second low voltage, wherein a connection node is connected between the eighteenth and nineteenth transistors, and the connection node is indirectly connected to the carry circuit.

19. The display apparatus of claim 18, wherein the second discharging circuit further comprises a diode connected between the connection node and the carry circuit.

20. The display apparatus of claim 18, wherein the buffer circuit comprises:
- a twentieth transistor comprising a control electrode and a first electrode configured to receive the (n−1)-th carry signal;
- a 21st transistor comprising a control electrode and a first electrode connected to a second electrode of the twentieth transistor and a second electrode connected to the control node; and
- a diode connected to the control node and a connection node, the connection node being connected between the twentieth and 21st transistors and the control node.

* * * * *